United States Patent
Senapati et al.

(10) Patent No.: US 9,966,459 B2
(45) Date of Patent: May 8, 2018

(54) SYMMETRICAL LATERAL BIPOLAR JUNCTION TRANSISTOR AND USE OF SAME IN CHARACTERIZING AND PROTECTING TRANSISTORS

(71) Applicant: GLOBALFOUNDRIES Inc., Grand Caymay (KY)

(72) Inventors: Biswanath Senapati, Mechanicville, NY (US); Jagar Singh, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 14/476,976

(22) Filed: Sep. 4, 2014

(65) Prior Publication Data

US 2016/0071962 A1    Mar. 10, 2016

(51) Int. Cl.
*H01L 29/735* (2006.01)
*H01L 29/08* (2006.01)
(Continued)

(52) U.S. Cl.
CPC ........ *H01L 29/735* (2013.01); *G01R 31/2621* (2013.01); *G01R 31/2884* (2013.01); *H01L 22/34* (2013.01); *H01L 27/0259* (2013.01); *H01L 27/0623* (2013.01); *H01L 29/0649* (2013.01); *H01L 29/0692* (2013.01); *H01L 29/0808* (2013.01); *H01L 29/0821* (2013.01); *H01L 29/1008* (2013.01); *H01L 29/1095* (2013.01); *H01L 29/41708* (2013.01); *H01L 29/42304* (2013.01)

(58) Field of Classification Search
None
See application file for complete search history.

(56) References Cited

U.S. PATENT DOCUMENTS 5,901,022 A * 5/1999 Ker ..................... H01L 23/5227
361/111
7,541,648 B2   6/2009 Jin
(Continued)

OTHER PUBLICATIONS

Complementary Thin-Base Symmetric Lateral Bipolar Transistors on SOI by Jin Cai (987-1-4577-0505-2/11) 2011.*
(Continued)

*Primary Examiner* — Fernando L Toledo
*Assistant Examiner* — Lawrence-Linh T Nguyen
(74) *Attorney, Agent, or Firm* — Wayne F. Reinke, Esq.; Heslin Rothenberg Farley & Mesiti P.C.

(57) ABSTRACT

A symmetrical lateral bipolar junction transistor (SLBJT) is provided. The SLBJT includes a p-type semiconductor substrate, a n-type well, an emitter of a SLBJT situated in the n-type well, a base of the SLBJT situated in the n-type well and spaced from the emitter by a distance on one side of the base, a collector of the SLBJT situated in the n-type well and spaced from the base by the distance on an opposite side of the base, and an electrical connection to the substrate outside the n-type well. The SLBJT is used to characterize a transistor in a circuit by electrically coupling the SLBJT to a gate of the test transistor, applying a voltage to the gate, and characterizing aspect(s) of the test transistor under the applied voltage. The SLBJT protects the gate against damage to the gate dielectric.

5 Claims, 3 Drawing Sheets

(51) Int. Cl.
*H01L 29/10* (2006.01)
*H01L 29/06* (2006.01)
*H01L 27/06* (2006.01)
*G01R 31/26* (2014.01)
*G01R 31/28* (2006.01)
*H01L 21/66* (2006.01)
*H01L 29/417* (2006.01)
*H01L 29/423* (2006.01)
*H01L 27/02* (2006.01)

(56) References Cited

U.S. PATENT DOCUMENTS

| 2006/0163660 | A1* | 7/2006 | Jin | H01L 27/0259 |
| | | | | 257/361 |
| 2006/0226488 | A1* | 10/2006 | Schneider | H01L 27/0259 |
| | | | | 257/362 |
| 2007/0096219 | A1* | 5/2007 | Akino | H01L 27/0705 |
| | | | | 257/370 |
| 2013/0342237 | A1* | 12/2013 | Li | G01R 31/40 |
| | | | | 324/764.01 |

OTHER PUBLICATIONS

Ning, Tak H. and Cai, Jin, "On the Performance and Scaling of Symmetric Lateral Bipolar Transistors on SOI," IEEE Journal of Electron Devices Society, vol. 1, No. 1, Jan. 2013, pp. 21-27.

* cited by examiner

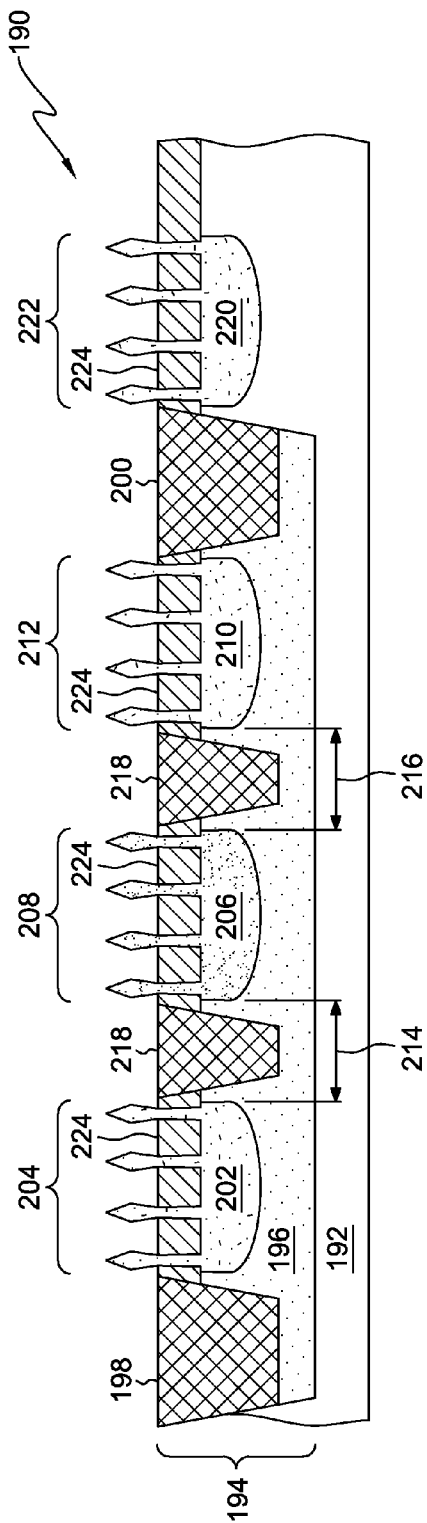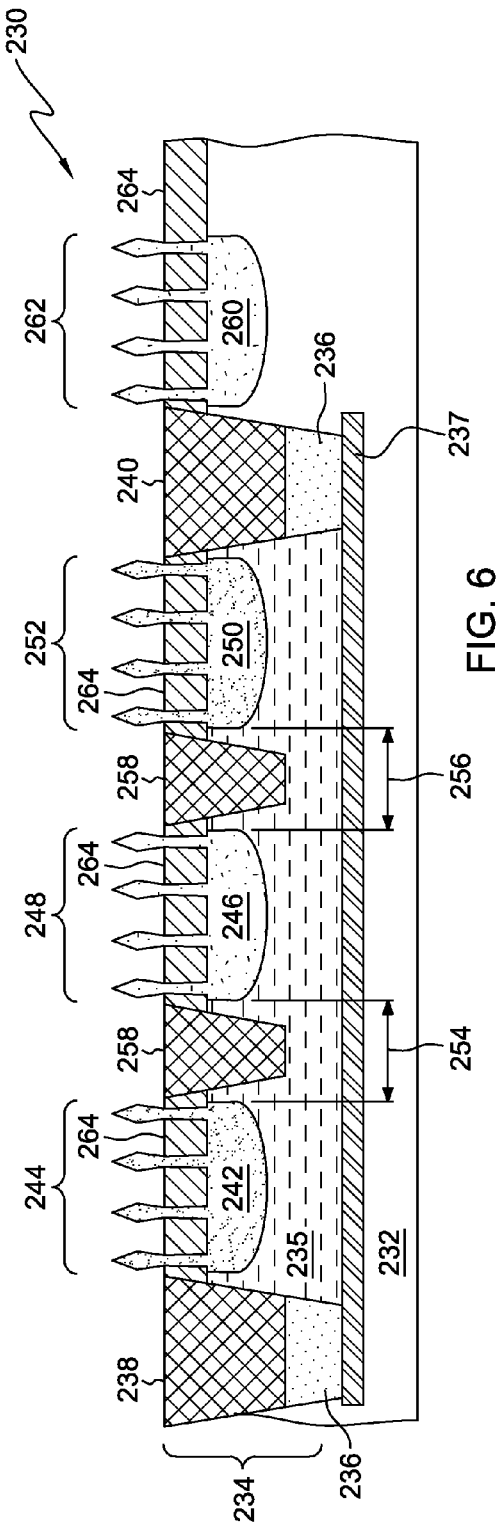

SYMMETRICAL LATERAL BIPOLAR JUNCTION TRANSISTOR AND USE OF SAME IN CHARACTERIZING AND PROTECTING TRANSISTORS

BACKGROUND OF THE INVENTION

Technical Field

The present invention generally relates to characterizing and protecting transistors. More particularly, the present invention relates to symmetrical lateral bipolar junction transistors and the use thereof in characterizing and protecting transistors.

Background Information

During the manufacture of integrated circuits with metal-oxide-semiconductor field-effect transistors, one common problem is gate oxide damage caused by the "antenna effect," more formally known as plasma-induced gate oxide damage. This type of damage can potentially cause yield and reliability problems for such integrated circuits. Currently, diodes are used to protect such transistors during characterization thereof. However, the use of diodes suffers limitations, such as the inability to measure gate-induced drain leakage current or gate leakage current, and inaccuracies in other testing characteristics.

Therefore, a need exists for improved characterization and protection of transistors.

SUMMARY OF THE INVENTION

The shortcomings of the prior art are overcome and additional advantages are provided through the provision, in one aspect, of a method of characterizing a transistor. The method includes providing a test transistor, the test transistor including a gate and a gate dielectric material. The method further includes providing a symmetrical lateral bipolar junction transistor (SLBJT), electrically coupling the SLBJT to the gate of the test transistor, applying a voltage to the gate, including applying one of a positive voltage and a negative voltage to the gate, and characterizing one or more aspects of the test transistor under the applied voltage. The SLBJT protects the gate against damage to the gate dielectric material, the characterizing includes measuring a current at one or more of the gate, the source, the drain and the substrate.

In accordance with another aspect, a symmetrical lateral bipolar junction transistor (SLBJT) is provided. The SLBJT includes a p-type semiconductor substrate, at least one well, and a first implant region of a first type for an emitter of a symmetrical lateral bipolar junction transistor (SLBJT). The first implant region is situated in one of the at least one well and the first type is one of n-type and p-type. Further, the SLBJT includes a second implant region of a second type opposite the first type for a base of the SLBJT, the second implant region being situated in the at least one well and spaced from the emitter on a first side of the base by a distance. Further, the SLBJT includes a third implant region of the first type for a collector of the SLBJT, the third implant region being situated in the at least one well and spaced from the base on a second side of the base opposite the first side by the distance. Further, the SLBJT includes a p-type implant region for electrically coupling to the substrate, the p-type implant region being situated outside the at least one well.

In accordance with yet another aspect, a circuit is provided. The circuit includes a test transistor including a gate, and a symmetrical lateral bipolar junction transistor (SLBJT). The SLBJT includes an emitter, a base and a collector. A distance between the emitter and the base is a same distance as that between the base and the collector, the emitter and the collector being on opposite sides of the base, and the emitter is electrically coupled to the gate of the test transistor.

These, and other objects, features and advantages of this invention will become apparent from the following detailed description of the various aspects of the invention taken in conjunction with the accompanying drawings.

BRIEF DESCRIPTION OF THE DRAWINGS

FIG. 5 is a cross-sectional view of one example of a non-planar PNP SLBJT, including a p-type substrate (or p-type well in a substrate of n-type), a raised structure coupled to the substrate, the SLBJT also including a n-type well in the raised structure between regions of isolation material, a p-type implant for the emitter with p-type epitaxial material thereon, a n-type implant for the base with n-type epitaxial material hereon, and a p-type implant for the collector with the p-type epitaxial material thereon, a same distance and isolation material separating the emitter from the base on one side, and the base from the collector on the opposite side, the non-planar PNP SLBJT also including a p-type implant separate from the n-type well with the p-type epitaxial material thereon for electrically coupling to the substrate, in accordance with one or more aspects of the present invention.

FIG. 6 is a cross-sectional view of one example of a non-planar NPN SLBJT, including a p-type substrate (or p-type well in a substrate of n-type), a raised structure coupled to the substrate, the SLBJT also including a n-type well in the raised structure between regions of isolation material, a p-type well, a "triple" n-type well, a n-type implant with n-type epitaxial material thereon for the emitter, a p-type implant with p-type epitaxial material thereon for the base, and a n-type implant with the n-type epitaxial material thereon for the collector, a same distance and isolation material separating the emitter from the base on one side and the base from the collector on the other side, the non-planar NPN SLBJT also including a p-type implant separate from the n-type well with the p-type epitaxial material thereon for electrically coupling to the substrate, in accordance with one or more aspects of the present invention.

DETAILED DESCRIPTION OF THE INVENTION

Figure 1:
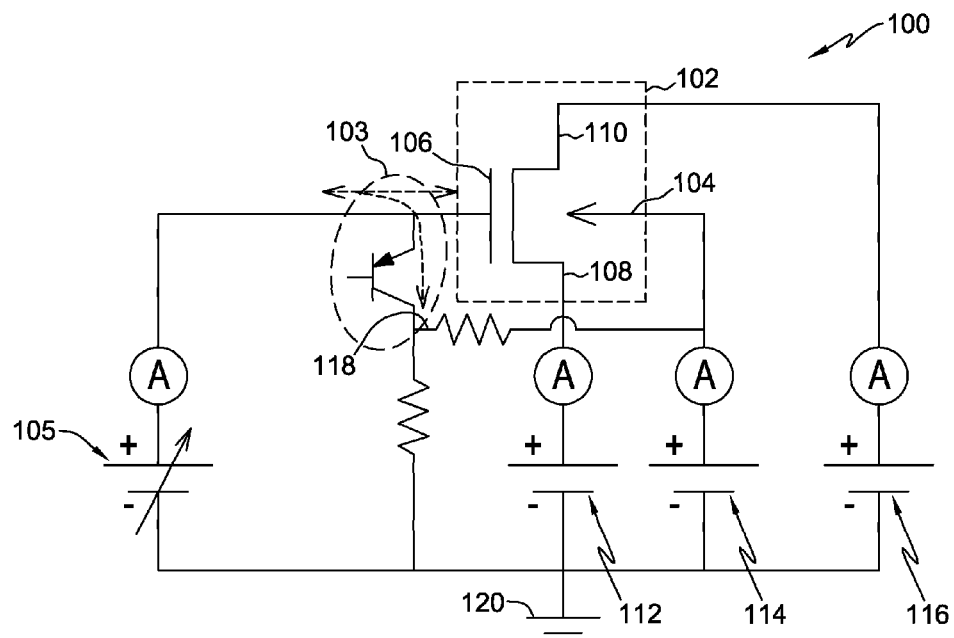
FIG. 1 depicts one example of a circuit for characterizing one or more aspects of a test transistor, the test transistor including a semiconductor substrate, a gate, a source and a drain, the circuit including a symmetrical lateral bipolar junction transistor, referred to herein as a "SLBJT" (PNP type in this example) electrically coupled to and for the protection of the test transistor against damage to a gate dielectric material in the test transistor from high voltage, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 depicts one example of a circuit 100 for characterizing one or more aspects of a test transistor 102, the test transistor including a semiconductor substrate 104, a gate 106, a source 108 and a drain 110, the circuit including a symmetrical lateral bipolar junction transistor 103, referred to herein as a "SLBJT" (PNP type in this example) electrically coupled to and for the protection of the test transistor against damage to a gate dielectric material in the test transistor from high voltage, in accordance with one or more aspects of the present invention.

A variable voltage source 105 is electrically coupled to the gate 106 of the test transistor 102. The aspects of the test transistor to be characterized may include, for example, current measurements at the gate and/or the source 108 and/or the drain 110. In addition, the aspects for characterization may further include, for example, measuring the current at substrate 104. The circuit further includes voltage sources 112, 114 and 116 for the source, substrate and drain, respectively. All of the voltage sources, including the variable voltage source, as well as collector 118 of SLBJT 103 are electrically coupled, directly or indirectly, to a ground 120 of the circuit.

The circuit 100 may be conventionally fabricated, for example, using known processes, techniques and measurement equipment. Further, although only a portion is shown for simplicity, it will be understood that, in practice, many such test transistors and corresponding SLBJT's may be included on the same bulk substrate.

In one example, substrate 104 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 104 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof;

an alloy semiconductor including GaAsP, AlInAs, GaInAs, GaInP, or GaInAsP or combinations thereof.

Figure 2:
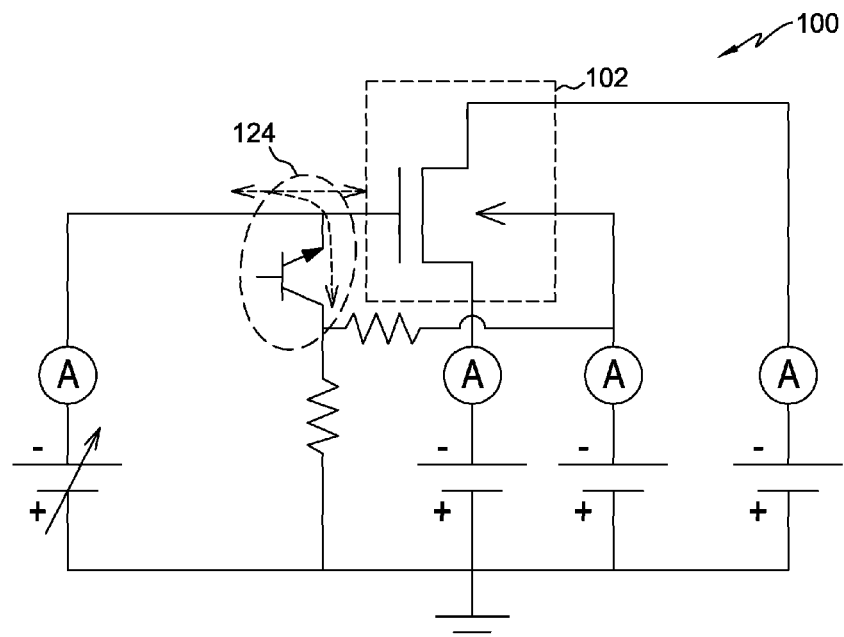
FIG. 2 is similar to FIG. 1, except that one example of a PNP SLBJT is used, instead of the PNP SLBJT of FIG. 1, in accordance with one or more aspects of the present invention.

FIG. 2 is similar to FIG. 1, except that a PNP SLBJT 124 is used, instead of the PNP SLBJT of FIG. 1, in accordance with one or more aspects of the present invention. The results obtained from characterizing test transistor aspects are the same for either the PNP SLBJT 103 or the PNP SLBJT. In other words, for purposes of characterizing the test transistor aspects, the two types of SLBJT's are interchangeable. The reasoning as to why they produce the same results will be discussed below with reference to FIGS. 3 and 4.

Figure 3:
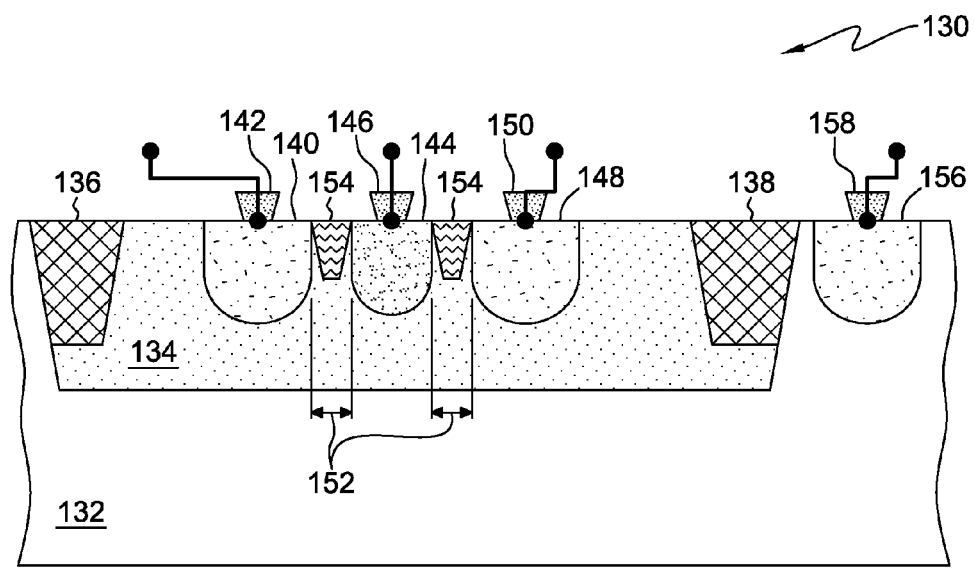
FIG. 3 is a cross-sectional view of one example of a planar PNP SLBJT, including a p-type substrate, a n-type well situated in the substrate between regions of isolation material, a p-type implant for the emitter contact, a n-type implant for the base contact and a second p-type implant for the collector contact, a same distance and isolation material separating the emitter from the base and the base from the collector on an opposite side of the base than the emitter, the planar PNP SLBJT also including a p-type implant outside the n-type well for electrically coupling to the substrate contact 158, in accordance with one or more aspects of the present invention.

FIG. 3 is a cross-sectional view of one example of a planar PNP SLBJT 130, including a p-type substrate 132, a n-type well 134 situated in the substrate between regions 136 and 138 of isolation material, a p-type implant 140 for the emitter contact 142, a n-type implant 144 for the base contact 146 and a second p-type implant 148 for the collector contact 150, a same distance 152 and isolation material 154 separating the emitter from the base and the base from the collector on an opposite side of the base than the emitter, the planar PNP SLBJT also including a p-type implant 156 outside the n-type well for electrically coupling to the substrate contact 158, in accordance with one or more aspects of the present invention.

PNP SLBJT 130 may be conventionally fabricated, for example, using known processes and techniques (e.g., growing epitaxial material and implanting impurities). In one example, the p-type implant material for the emitter, collector and substrate are all a same p-type implant material, for example, epitaxial silicon germanium, and/or the n-type implant material for the base may be, for example, phosphorus or arsenic. The n-type well may include, for example, phosphorus or arsenic doped silicon material. The isolation material 136, 154 and 138 may include a same isolation material, for example, a gap fill oxide or nitride, or a combination of both, in shallow (154) and deep (136, 138) trenches. The distance separating the emitter from the base, and the base from the collector may be, for example, about 0.2 microns to about 5 microns, and the implants may each have a depth of about 0.1 microns to about 0.3 microns.

Figure 4:
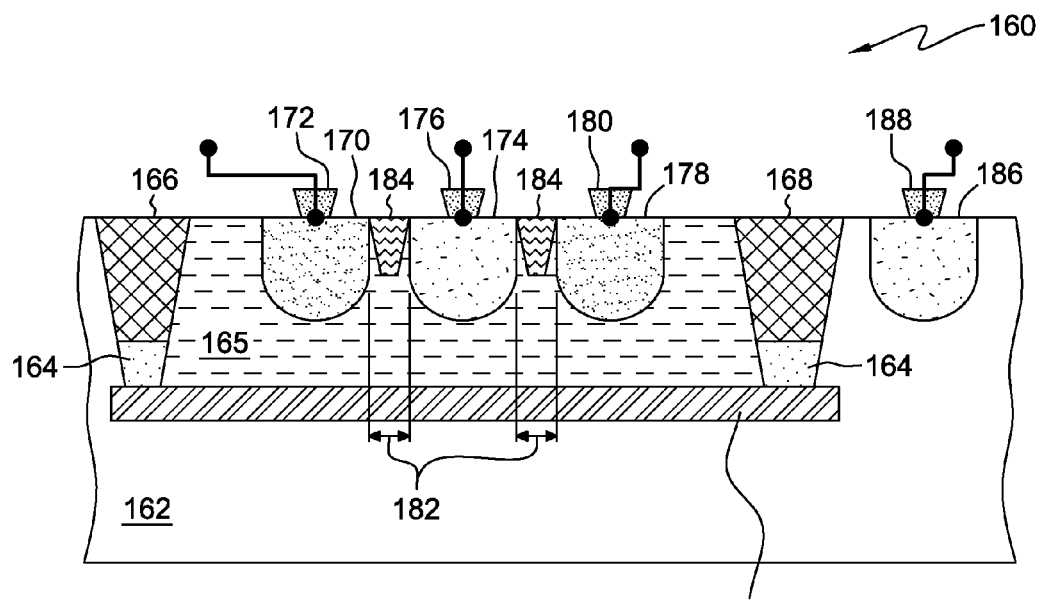
FIG. 4 is a cross-sectional view of one example of a planar NPN SLBJT, including a p-type substrate, a p-type well in the substrate between regions of isolation material, a n-type well, a "triple" n-type well, a n-type implant for the emitter contact, a p-type implant for the base contact and a second n-type implant for the collector contact, a same distance and isolation material separating the emitter implant from the base implant and the base implant from the collector implant on the opposite side of the base implant from the emitter implant, the planar NPN SLBJT also including a p-type implant outside the n-type well for electrically coupling to the substrate via a substrate contact, in accordance with one or more aspects of the present invention.

FIG. 4 is a cross-sectional view of one example of a planar NPN SLBJT 160, including a p-type substrate 162, a p-type well 165 in the substrate between regions 166 and 168 of isolation material, a n-type well 164, a "triple" n-type well 167, a n-type implant 170 for the emitter contact 172, a p-type implant 174 for the base contact 176 and a second n-type implant 178 for the collector contact 180, a same distance 182 and isolation material separating the emitter implant from the base implant and the base implant from the collector implant on the opposite side of the base implant from the emitter implant, the planar NPN SLBJT also including a p-type implant 186 outside the n-type well for electrically coupling to the substrate via a substrate contact 188, in accordance with one or more aspects of the present invention.

NPN SLBJT 160 may be conventionally fabricated, for example, using known processes and techniques (e.g., implanting and growing epitaxial material). In one example, the p-type implant material for the base and substrate are a same p-type implant material, for example, epitaxial silicon germanium, and/or the n-type implant material for the emitter and collector may be, for example, phosphorus or arsenic. The n-type well may include, for example, phosphorus or arsenic doped silicon material, and may include, for example, a "triple" n-well, which is phosphorus or arsenic doped silicon material. The p-type well may include, for example, boron doped silicon material. The isolation material 166, 168 and 184 may include a same isolation material, for example, a gap fill oxide or nitride, or a combination of both, in shallow (154) and deep (136, 138) trenches. The distance separating the emitter from the base, and the base from the collector may be, for example, about 0.2 microns to about 5 microns, and the implants may each have a depth of about 0.1 microns to about 0.3 microns.

The PNP SLBJT of FIG. 3 and the NPN SLBJT of FIG. 4 are interchangeable for use in characterizing and protecting a test transistor, because operation of each one in either forward or reverse bias mirrors the opposite bias.

FIG. 5 is a cross-sectional view of one example of a non-planar PNP SLBJT 190, including a p-type substrate 192 (or p-type well in a substrate of n-type), a raised structure 194 coupled to the substrate, the SLBJT also including a n-type well 196 in the raised structure between regions 198 and 200 of isolation material, a p-type implant 202 for the emitter with p-type epitaxial material 204 thereon, a n-type implant 206 for the base with n-type epitaxial material 208 thereon, and a p-type implant 210 for the collector with the p-type epitaxial material 212 thereon, a same distance 214 and 216 and isolation material 218 separating the emitter from the base on one side, and the base from the collector on the opposite side, the non-planar PNP SLBJT also including a p-type implant 220 separate from the n-type well with the p-type epitaxial material 222 thereon for electrically coupling to the substrate, in accordance with one or more aspects of the present invention.

Non-planar PNP SLBJT 190 may be conventionally fabricated, for example, using known processes and techniques (e.g., implants and epitaxial growth). In one example, substrate 190 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 190 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structure(s) may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type.

In one example, the p-type implant material in non-planar PNP SLBJT 190 and p-type epitaxial material for the emitter, collector and substrate may all be a same type of material, for example, silicon germanium and epitaxial silicon germanium, and/or the material for the n-type implant and n-type epitaxial material for the base may be, for example, carbon-doped silicon and epitaxial carbon-doped silicon. The n-type well may include, for example, phosphorus or arsenic doped silicon material. The isolation material 198, 200 and 218 may include a same isolation material, for example, a gap fill oxide or nitride, or a combination of both, in deep trenches. The distance separating the emitter from the base, and the base from the collector may be, for example, about 0.2 microns to about 5 microns, and the implants may each have a depth of about 0.1 microns to about 0.3 microns. Finally, a dielectric material 224 above the implants may be, for example, a gap fill oxide or nitride, or a combination of both, in shallow trenches.

FIG. 6 is a cross-sectional view of one example of a non-planar NPN SLBJT 230, including a p-type substrate 232 (or p-type well in a substrate of n-type), a raised structure 234 coupled to the substrate, the SLBJT also including a n-type well 236, a p-type well 235 in the raised structure between regions 238 and 240 of isolation material, a "triple" n-type well 237, a n-type implant 242 with n-type epitaxial material 244 thereon for the emitter, a p-type implant 246 with p-type epitaxial material 248 thereon for the base, and a n-type implant 250 with the n-type epitaxial material 252 thereon for the collector, a same distance 254 and 256 and isolation material 258 separating the emitter from the base on one side and the base from the collector on the other side, the non-planar NPN SLBJT also including a p-type implant 260 separate from the n-type well with the p-type epitaxial material 262 thereon for electrical coupling to the substrate, in accordance with one or more aspects of the present invention.

Non-planar NPN SLBJT 230 may be conventionally fabricated, for example, using known processes and techniques (e.g., implants and epitaxial growth). In one example, substrate 230 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 230 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

In one example, the raised structure(s) may take the form of a "fin." The raised structure(s) may be etched from a bulk substrate, and may include, for example, any of the materials listed above with respect to the substrate. Further, some or all of the raised structure(s) may include added impurities (e.g., by doping), making them n-type or p-type.

In one example, the n-type implant material in non-planar NPN SLBJT 230 and n-type epitaxial material for the emitter and collector may be a same type of material, for example, carbon-doped silicon and epitaxial carbon-doped silicon, and/or the material for the p-type implant and p-type epitaxial material for the base and substrate may be, for example, silicon germanium and epitaxial silicon germanium. The n-type well may include, for example, phosphorus or arsenic doped silicon material, and may be a "triple" n-well, which may also include, for example, phosphorus or arsenic doped silicon material. The p-type well may include, for example, boron doped silicon material. The isolation material 238, 240 and 258 may include a same isolation material, for example, a gap fill oxide or nitride, or a combination of both, in deep trenches. The distance 254 separating the emitter from the base on one side of the base, and the distance 256 separating the collector from the base on the other side of the base may be, for example, about 0.2 microns to about 5 microns, and the implants may each have a depth of about 0.1 microns to about 0.3 microns. Finally, the dielectric material 264 above the implants may be, for example, a gap fill oxide or nitride, or a combination of both, in shallow trenches.

In a first aspect, disclosed above is a method of characterizing a transistor. The method includes providing a test transistor, the test transistor including a gate and gate dielectric material, and providing a symmetrical lateral bipolar junction transistor (SLBJT). The method further includes electrically coupling the SLBJT to the gate of the test transistor, applying a voltage to the gate, and characterizing aspect(s) of the test transistor under the applied voltage. The SLBJT protects the gate against damage to the gate dielectric material.

In one example, providing the test transistor in the method of the first aspect may include, for example, providing a planar test transistor, and providing the SLBJT may include, for example, providing a planar SLBJT.

In one example, providing the test transistor in the method of the first aspect may include, for example, providing a non-planar test transistor, and providing the SLBJT may include, for example, providing a non-planar SLBJT.

In one example, providing the SLBJT in the method of the first aspect may include, for example, providing a PNP SLBJT, or as another example, the SLBJT may include a NPN SLBJT.

In one example, applying a voltage in the method of the first aspect may include, for example, applying one of a positive voltage and a negative voltage to the gate. In another example, the test transistor further includes a source, a drain and a semiconductor substrate, and the characterizing includes measuring a current at the gate and/or the source and/or the drain and/or the substrate.

In one example, the SLBJT includes an emitter, a collector and a base, and providing the SLBJT in the method of the first aspect may include, for example, distancing the emitter from the base on a first side of the base by a distance, and distancing the collector from the base on a second side of the base opposite the first side by the same distance.

In a second aspect, disclosed above is symmetrical lateral bipolar junction transistor (SLBJT). The SLBJT includes a p-type semiconductor substrate, well(s), and a first implant region of a first type for an emitter of a symmetrical lateral bipolar junction transistor (SLBJT). The first implant region is situated in one of the well(s) and the first type is one of n-type and p-type. Further, the SLBJT includes a second implant region of a second type opposite the first type for a base of the SLBJT, the second implant region being situated in the well(s) and spaced from the emitter on a first side of the base by a distance. Further, the SLBJT includes a third implant region of the first type for a collector of the SLBJT, the third implant region being situated in the well(s) and spaced from the base on a second side of the base opposite the first side by the distance. Further, the SLBJT includes a p-type implant region for electrically coupling to the substrate, the p-type implant region being situated outside the well(s).

In one example, the SLBJT of the second aspect may further include, for example, a p-type raised semiconductor structure coupled to the substrate, the well(s), the SLBJT, and the substrate implant region being situated in the raised structure. Where the raised structure is present, the well(s) may include, for example, a n-type well, the emitter, the collector and a contact for the substrate each including p-type epitaxial material over the respective implant regions, the base including n-type epitaxial material over the second implant region, and the implant regions for the emitter, base and collector being situated in the n-type well. Alternatively, where the raised structure is present, the well(s) may include, for example, a p-type well within a n-type well and a triple n-type well below the p-type well and n type well, the emitter and the collector each including n-type epitaxial material over the respective implant regions, the base and a contact for the substrate each including p-type epitaxial material over the respective implant regions, and the implant regions for the emitter, base and collector being situated in the p-type well.

In one example, the well(s) of the SLBJT of the second aspect may include, for example, a n-type well, and the n-type well and implant region for the substrate may be, for example, situated in the substrate. Further, the first implant region, the third implant region and the substrate implant region may each include, for example, a p-type implant and the second implant region may include, for example, a n-type implant.

In one example, the well(s) and the implant region for the substrate of the SLBJT of the second aspect may be, for example, situated in the substrate, the well(s) including a p-type well within a n-type well and a triple n-type well below the p-type well and n-type well, the first implant region and the third implant region each including a n-type implant, and the second implant region and substrate implant region each including a p-type implant.

In one example, the distance separating the emitter from the base and the base from the collector of the SLBJT of the second aspect may be, for example, about 0.2 microns to about 5 microns.

In one example, each of the implant regions of the SLBJT of the second aspect may have a depth of about 0.1 microns to about 3 microns.

In one example, the SLBJT of the second aspect may have, for example, a breakdown voltage of one of about 9 volts and about 12 volts.

In a third aspect, disclosed above is a circuit. The circuit includes a test transistor having a gate, and a symmetrical lateral bipolar junction transistor (SLBJT). The SLBJT includes an emitter, a base and a collector. A distance between the emitter and the base on one side of the base is a same distance as that between the base and the collector on an opposite side of the base, and the emitter is electrically coupled to the gate of the test transistor.

In one example, the SLBJT of the circuit of the third aspect may include, for example, one of a planar SLBJT and a non-planar SLBJT.

In one example, the SLBJT of the circuit of the third aspect may be, for example, one of PNP-type and NPN-type.

In one example, the distance separating the emitter from the base and the base from the collector of the SLBJT in the circuit of the third aspect may be, for example, about 0.2 microns to about 5 microns.

In one example, the SLBJT of the circuit of the third aspect may have, for example, a breakdown voltage of one of about 9 volts and about 12 volts, based on a type of gate dielectric used for the test transistor.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
providing a test transistor, the test transistor comprising a gate and gate dielectric material;
providing a symmetrical lateral bipolar junction transistor (SLBJT);
electrically coupling the SLBJT to the gate of the test transistor;
applying a voltage to the gate, comprising applying one of a positive voltage and a negative voltage to the gate; and
characterizing one or more aspects of the test transistor under the applied voltage, wherein the SLBJT protects the gate against damage to the gate dielectric material, the characterizing comprising measuring a current at one or more of the gate, the source, the drain and the substrate.

2. The method of claim 1, wherein providing the test transistor comprises providing a planar test transistor, and wherein providing the SLBJT comprises providing a planar SLBJT.

3. A method, comprising:
providing a test transistor, the test transistor comprising a gate and gate dielectric material;
providing a symmetrical lateral bipolar junction transistor (SLBJT);
electrically coupling the SLBJT to the gate of the test transistor;
applying a voltage to the gate, comprising applying one of a positive voltage and a negative voltage to the gate;
characterizing one or more aspects of the test transistor under the applied voltage, wherein the SLBJT protects the gate against damage to the gate dielectric material, the characterizing comprising measuring a current at one or more of the gate, the source, the drain and the substrate; and
wherein providing the test transistor comprises providing a non-planar test transistor, and wherein providing the SLBJT comprises providing a non-planar SLBJT.

4. The method of claim 1, wherein the SLBJT comprises one of a PNP SLBJT and a NPN SLBJT.

5. A method, comprising:
providing a test transistor, the test transistor comprising a gate and gate dielectric material:
providing a symmetrical lateral bipolar junction transistor (SLBJT);
electrically coupling the SLBJT to the gate of the test transistor;
applying a voltage to the gate, comprising applying one of a positive voltage and a negative voltage to the gate;
characterizing one or more aspects of the test transistor under the applied voltage, wherein the SLBJT protects the gate against damage to the gate dielectric material, the characterizing comprising measuring a current at one or more of the gate, the source, the drain and the substrate; and
wherein the SLBJT comprises an emitter, a collector and a base, and wherein providing the SLBJT comprises distancing the emitter from the base on a first side of the base by a distance and distancing the collector from the base on a second side of the base opposite the first side by the distance.

* * * * *